United States Patent
Bailey et al.

(10) Patent No.: US 9,380,727 B2
(45) Date of Patent: Jun. 28, 2016

(54) MODULAR INFORMATION TECHNOLOGY (IT) RACK AND AIR FLOW SYSTEM

(71) Applicant: DELL PRODUCTS, L.P., Round Rock, TX (US)

(72) Inventors: Edmond I. Bailey, Cedar Park, TX (US); Steven Embleton, Austin, TX (US)

(73) Assignee: DELL PRODUCTS, L.P., Round Rock, TX (US)

( * ) Notice: Subject to any disclaimer, the term of this patent is extended or adjusted under 35 U.S.C. 154(b) by 88 days.

(21) Appl. No.: 14/506,325

(22) Filed: Oct. 3, 2014

(65) Prior Publication Data

US 2016/0100502 A1    Apr. 7, 2016

(51) Int. Cl.

| G06F 1/20 | (2006.01) |
|---|---|
| H05K 5/00 | (2006.01) |
| H05K 7/20 | (2006.01) |
| H05K 7/14 | (2006.01) |
| H05K 13/00 | (2006.01) |
| A47B 47/00 | (2006.01) |
| B65B 13/02 | (2006.01) |
| B65B 5/06 | (2006.01) |

(52) U.S. Cl.
CPC .......... *H05K 7/1488* (2013.01); *A47B 47/0091* (2013.01); *B65B 5/068* (2013.01); *B65B 13/02* (2013.01); *H05K 7/1491* (2013.01); *H05K 7/20709* (2013.01); *H05K 13/0023* (2013.01)

(58) Field of Classification Search
CPC . H05K 7/183; H05K 7/1488; H05K 13/0023; H05K 7/20709; H05K 7/1491; A47B 47/0091; A47B 96/145; B65B 13/02; B65B 5/068; H02B 1/013; H02B 1/308
USPC ............. 361/679.01, 679.02, 679.46–679.54, 361/688–727; 211/13.1, 26, 49.1, 59.4, 211/126.12, 183, 188, 189, 194, 195; 312/223.1–223.3, 223.6, 257.1–265.6
See application file for complete search history.

(56) References Cited

U.S. PATENT DOCUMENTS

| 5,639,150 | A | * | 6/1997 | Anderson | ............ | A47B 96/145 |
|---|---|---|---|---|---|---|
| | | | | | | 312/265.2 |
| 5,894,106 | A | * | 4/1999 | Schwenk | ............. | H05K 9/0016 |
| | | | | | | 174/50 |
| 5,997,117 | A | * | 12/1999 | Krietzman | ............. | H02B 1/301 |
| | | | | | | 312/265.4 |
| 6,238,029 | B1 | * | 5/2001 | Marzec | .................... | H02B 1/30 |
| | | | | | | 211/26 |
| 9,198,324 | B1 | * | 11/2015 | Yousif | .................... | H05K 7/186 |
| 2005/0284833 | A1 | * | 12/2005 | Wyatt | ................. | A47B 96/1408 |
| | | | | | | 211/189 |
| 2008/0164794 | A1 | * | 7/2008 | Lai | ........................ | H05K 7/1488 |
| | | | | | | 312/298 |
| 2008/0170373 | A1 | * | 7/2008 | Just | ...................... | H05K 7/1488 |
| | | | | | | 361/729 |

* cited by examiner

*Primary Examiner* — Anthony Haughton
*Assistant Examiner* — Yahya Ahmad
(74) *Attorney, Agent, or Firm* — Isidore PLLC

(57) ABSTRACT

A method for designing and assembling a modular IT rack includes a manufacturer designing and constructing lightweight, modular corrugated cardboard modules/segments and corresponding banding and corner components that can be used to assemble the modular IT rack. A user/assembler of the modular IT rack assembles modular tray grouping and enclosure (MTGE) casing units using a first set of cardboard modules. The user constructs trays using a second set of cardboard modules. The user affixes cable support components to the sides of sub-groups of the constructed trays. The user encloses sub-groups of trays having the affixed cable support components within the assembled MTGE casing units to create MTGE blocks. The user vertically stacks the MTGE blocks having the tray sub-groups and the affixed cable support components enclosed within. The user aligns and secures the vertically stacked MTGE blocks in a fixed position using banding and corner components.

20 Claims, 12 Drawing Sheets

MODULAR INFORMATION TECHNOLOGY (IT) RACK AND AIR FLOW SYSTEM

BACKGROUND

1. Technical Field

The present disclosure generally relates to information technology (IT) server racks and in particular to configuration and design of lightweight IT racks used to support information handling systems.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large scale IHSes are often placed within an information technology (IT) rack which is designed to support the weight and other requirements of the various IT gear included within the IHS. However, these conventional racks have a fixed size and are constructed using heavy metallic components and fasteners. The conventional rack is bulky and does not enable optimization of size and scale and is costly to construct and ship to an end customer.

BRIEF SUMMARY

Disclosed are a modular, easily-assembled, lightweight, structurally-rigid (MELS) information technology (IT) rack and a method for constructing and/or assembling a MELS IT rack. According to one aspect of the disclosure, the MELS IT rack is a stacked arrangement of mini-rack modules. Each mini-rack module includes: an exterior perimeter casing providing a volumetric, vertical space with lateral sides defining an interior space extending between a front opening and a rear opening of a casing created with defined foldable corners/edges; and multiple vertically stacked trays comprised of a lightweight material constructed with a contiguous surface material having foldable corners/edges that enable each tray to be extendable into a rectangular-shaped volume within which an IT gear can be inserted. Corner components positioned vertically at each of four corners of the stacked arrangement of mini-rack modules provide vertical rigidity to the rack assembly. Banding components extend horizontally around the perimeter of the stacked arrangement of mini rack modules to fixably hold each of the corner components in place and provide lateral support for the rack structure.

According to one aspect of the disclosure, the modular tray grouping and enclosure (MTGE) units and/or the assembled rack includes a back panel which can be implemented using at least one baffle. The baffle(s) includes air flow directing (AFD) apertures or holes with flanges that fold inwards towards the chassis of the IT rack. The baffle is designed to guide airflow through the IT rack using the AFD apertures and to provide a separation of the hot and cold aisles for IT gear that is placed within the IT rack.

According to one specific embodiment, a manufacturer designs and constructs lightweight, modular corrugated cardboard modules/segments and corresponding banding and corner components that can be used to assemble the MELS IT rack. A user/assembler of the MELS IT rack assembles modular tray grouping and enclosure (MTGE) units using a first set of cardboard modules. The user configures IT trays using a second set of cardboard modules and pairs of insertable, rigid side pieces. The user vertically stacks the MTGE units having the inserted IT trays and places vertical corner pieces extending from a bottom MTGE unit to the top MTGE unit to align the MTGE units and provide structural support along the vertical plane to the stacked units. The user secures the vertically stacked MTGE units in a fixed position using one or more banding components, which are extended around the perimeter of the stacked units and corner components in a horizontal plane. In one embodiment, the user inserts cable support modules towards the interior sides of the MTGE units, flanking both sides of the IT trays which are inserted into the assembled MTGE units. Additionally, in one embodiment, the user affixes a back panel or baffle having one or more flanged AFD apertures that are positioned to allow for single directional flow of hot exhaust air from IT components that operate within the modular rack. The baffle provides a cold aisle and hot aisle separator for the MELS IT rack.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
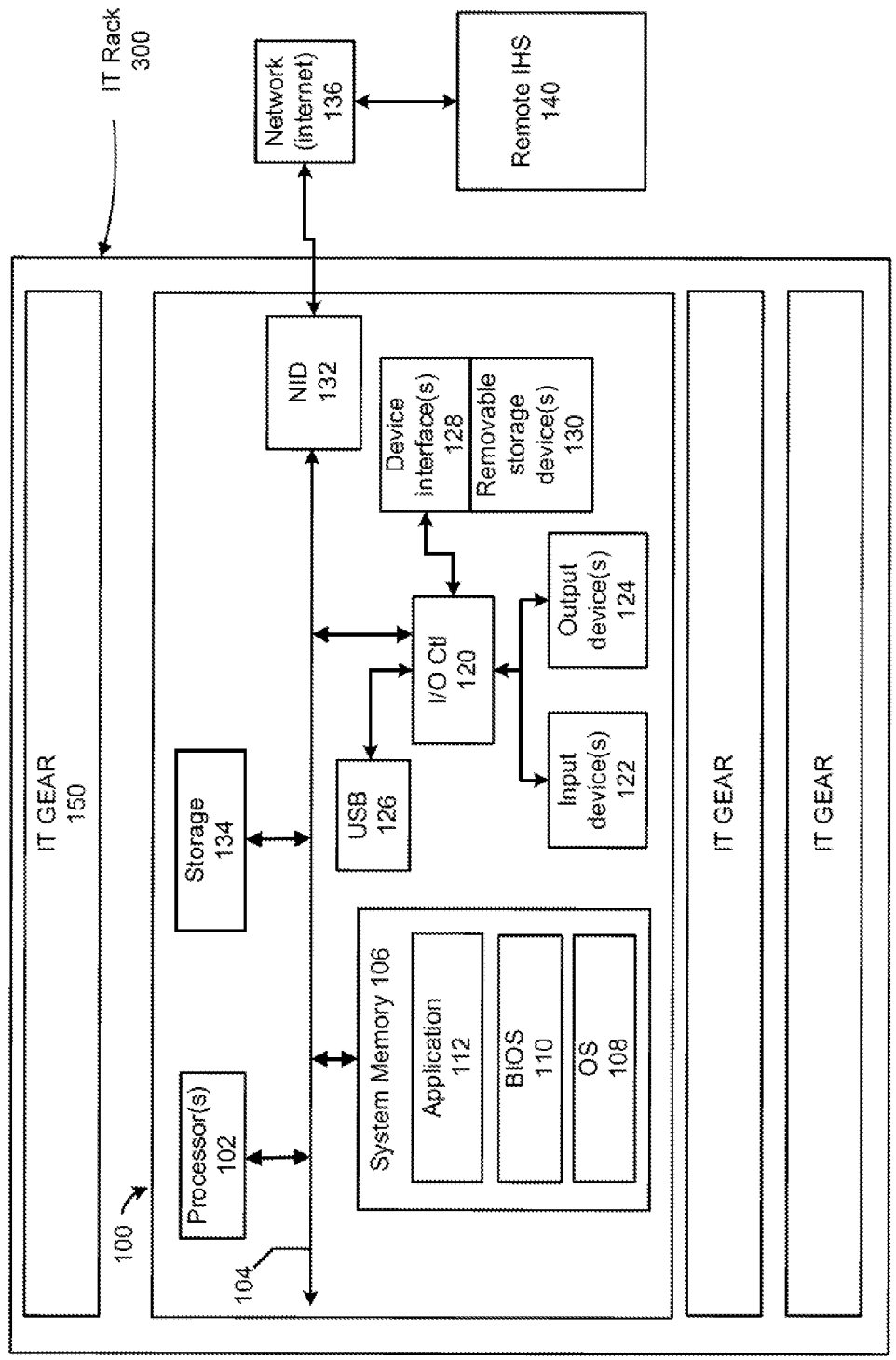
FIG. 1 illustrates an example information handling system (IHS) that can be one information technology (IT) gear located within the representation of a rack, according to one or more embodiments.

The illustrative embodiments provide a modular, easily-assembled, lightweight, and structurally-rigid (MELS) IT rack and a method for constructing and assembling the modular IT rack. The MELS IT rack is a stacked arrangement of mini-rack modules. Each mini-rack module includes: an exterior perimeter casing providing a volumetric, vertical space with lateral sides defining an interior space extending between a front opening and a rear opening of a casing created with defined foldable corners/edges; and multiple vertically stacked trays comprised of a lightweight material constructed with a contiguous surface material having foldable corners/edges that enable each tray to be extendable into a rectangular shaped volume within which an IT gear can be inserted. Corner components positioned vertically at each of four corners of the stacked arrangement of mini rack modules provide vertical rigidity to the rack assembly. Banding components extend horizontally around the perimeter of the stacked arrangement of mini rack modules to fixably hold each of the corner components in place and provide lateral support for the rack structure.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Those of ordinary skill in the art will appreciate that the hardware, firmware/software utility, and software components and basic configuration thereof depicted in the following FIGS. 1, 3-10 may vary. The illustrative components of IHS 100 and MELS IT rack 300 and baffle 600 are not intended to be exhaustive, but rather are representative to highlight some of the components that are utilized to implement certain of the described embodiments. For example, different configurations of an IHS and/or a rack may be provided, containing other devices/components, which may be used in addition to or in place of the hardware depicted, and may be differently configured. The depicted example is not meant to imply architectural or other limitations with respect to the presently described embodiments and/or the general disclosures provided herein.

FIG. 1 illustrates a block diagram representation of an example information handling system (IHS) 100, which represents one or more possible embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components. In the present disclosure, a rack structure utilized to support a rack-based information handling system is illustrated and described. Thus, within the description, the entire rack can be described as a single information handling system, although it is appreciated that the individual IT gear inserted within one chassis of the rack can be a separate information handling system from other IT gear within the larger rack.

Referring specifically to FIG. 1, there is illustrated a block diagram representation of a MELS IT rack 300 having multiple IT gear 150 inserted therein. Example IT gear that can be individually considered an IHS 100 includes one or more processor(s) 102 coupled to system memory 106 via system interconnect 104. System interconnect 104 can be interchangeably referred to as a system bus, in one or more embodiments. Also coupled to system interconnect 104 is storage 134 within which can be stored one or more software and/or firmware modules and/or data (not specifically shown). In one embodiment, storage 134 can be a hard drive or a solid state drive. The one or more software and/or firmware modules within storage 134 can be loaded into system memory 106 during operation of IHS 100. As shown, system memory 106 can include therein a plurality of modules, including Basic Input/Output System (BIOS) 110, operating system (O/S) 108, applications 112 and firmware (not shown). The various software and/or firmware modules have varying functionality when their corresponding program code is executed by processor(s) 102 or other processing devices within IHS 100. As illustrated, IHS 100 is located/placed within a larger structure of an IT rack 300 (generally illustrated in FIG. 1 as a surrounding exterior line, with specific structural details provided in FIGS. 3-10).

In one or more embodiments, BIOS 110 comprises additional functionality associated with unified extensible firmware interface (UEFI), and can be more completely referred to as BIOS/UEFI 110 in these embodiments. The various software and/or firmware modules have varying functionality when their corresponding program code is executed by processor(s) 102 or other processing devices within IHS 100.

IHS 100 further includes one or more input/output (I/O) controllers 120 which support connection to and processing of signals from one or more connected input device(s) 122, such as a keyboard, mouse, touch screen, or microphone. I/O controllers 120 also support connection to and forwarding of output signals to one or more connected output device(s) 124, such as a monitor or display device or audio speaker(s). In addition, IHS 100 includes universal serial bus (USB) 126 which is coupled to I/O controller 120. Additionally, in one or more embodiments, one or more device interface(s) 128, such as an optical reader, a universal serial bus (USB), a card reader, Personal Computer Memory Card International Association (PCMCIA) port, and/or a high-definition multimedia interface (HDMI), can be associated with IHS 100. Device interface(s) 128 can be utilized to enable data to be read from or stored to corresponding removable storage device(s) 130, such as a compact disk (CD), digital video disk (DVD), flash drive, or flash memory card. In one or more embodiments, device interface(s) 128 can also provide an integration point for connecting other device(s) to IHS 100. In one implementation, IHS 100 connects to remote IHS 140 using device interface(s) 128. In such implementation, device interface(s) 128 can further include General Purpose I/O interfaces such as $I^2C$, SMBus, and peripheral component interconnect (PCI) buses.

IHS 100 comprises a network interface device (NID) 132. NID 132 enables IHS 100 to communicate and/or interface with other devices, services, and components that are located external to IHS 100. These devices, services, and components can interface with IHS 100 via an external network, such as example network 136, using one or more communication protocols. In particular, in one implementation, IHS 100 uses NID 132 to connect to remote IHS 140 via an external network 136.

Network 136 can be a wired local area network, a wireless wide area network, wireless personal area network, wireless local area network, and the like, and the connection to and/or between network 136 and IHS 100 can be wired or wireless or a combination thereof. For purposes of discussion, network 136 is indicated as a single collective component for simplicity. However, it is appreciated that network 136 can comprise one or more direct connections to other devices as well as a more complex set of interconnections as can exist within a wide area network, such as the Internet.

Figure 2:
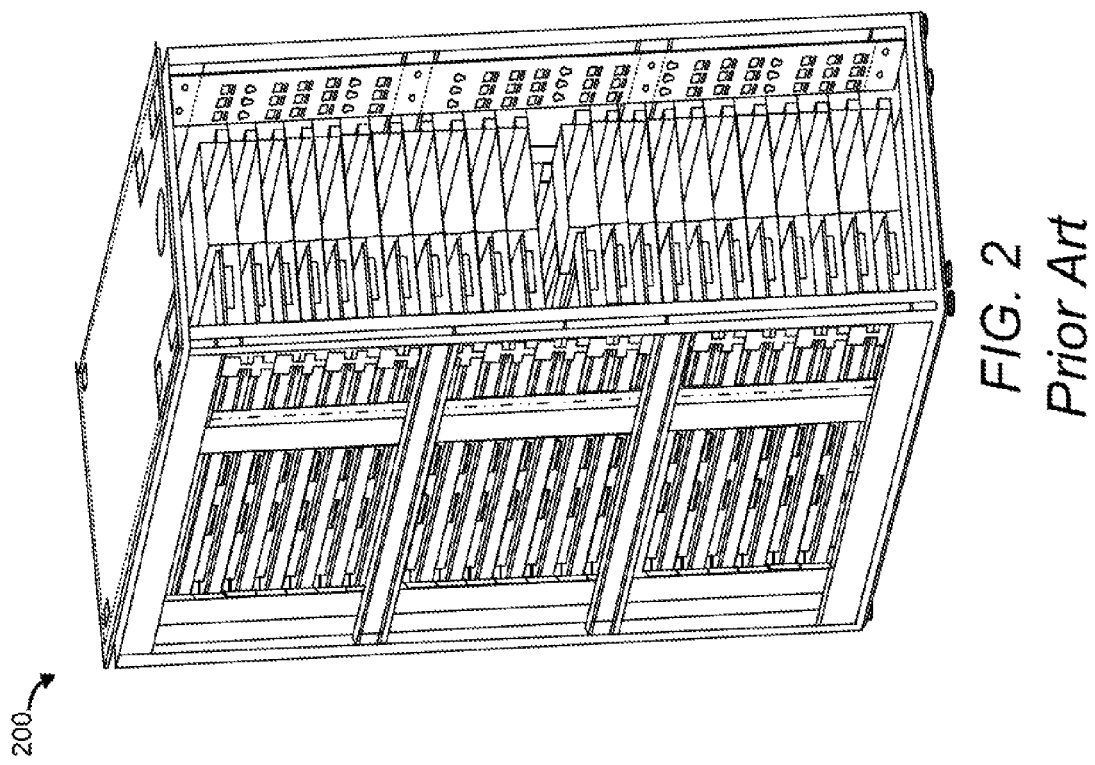
FIG. 2 illustrates a conventional rack, according to the prior art.

FIG. 2 illustrates a conventional rack, according to the prior art. Conventional rack 200 has a fixed size and is constructed using heavy metallic components, such as components constructed using steel, and metal fasteners (screws, etc.). The conventional rack is bulky and is not modular to allow for optimization of sizing and scale. Further, the conventional rack is very expensive to ship and difficult to assemble. Thus, typical assembly would occur at the manufacturing facility before shipping of the larger rack structures in freight containers.

Figure 3:
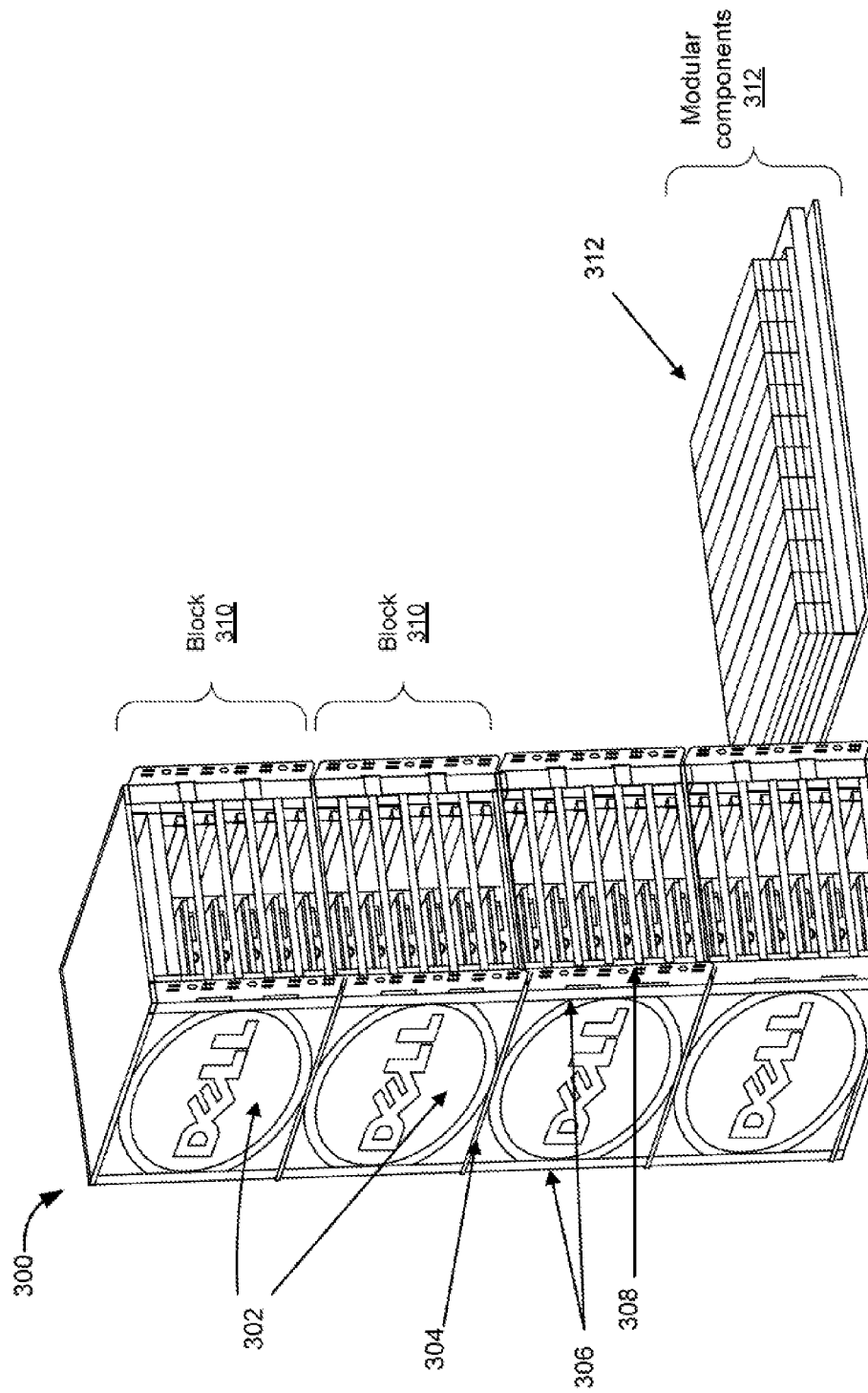
FIG. 3 illustrates a modular, easily-assembled, lightweight, and structurally-rigid (MELS) information technology (IT) rack assembly and a flat-packed representation of the sub-components thereof, according to one embodiment.

FIG. 3 illustrates an example MELS IT rack assembly, according to one embodiment. The description of FIG. 3 can be best understood with reference to several of the later figures and in particular FIGS. 9 and 10. MELS IT rack 300 is assembled using modular components 312 which can be constructed using lightweight, structural material, such as corrugated cardboard material. Rack 300 comprises modular tray grouping and enclosure (MTGE) units 302 which respectively enclose sub-groups of IT gear receiving (ITGR) trays and cable support components to create an MTGE block 310. Each MTGE block 310 includes a specific number of ITGR trays (e.g., ITGR trays 1004 of FIG. 10) in which electronic components and/or IT gear 150 (FIG. 1) can be inserted/placed. Using the modularity provided by these MTGE blocks 310 as the building blocks for MELS IT rack 300 allows the MELS IT rack 300 to be expanded or downsized by adding or removing one or more MTGE blocks 310 based on user/customer requirements of MELS IT rack 300 and/or vertical space limitations.

MELS IT rack 300 further comprises banding components 304 and vertical corner components 306. In addition, MELS IT rack 300 comprises cable support panels/components 308 and horizontal panels 314. Additionally, although not shown in FIG. 3, rack 300 comprises back panels 904 (FIG. 9) and/or baffle 1000 (FIG. 10).

Each MTGE block 310 is vertically stacked on and/or below another MTGE block 310 with intermediate horizontal panels (e.g., horizontal panel 608 of FIG. 6) placed between adjacent MTGE blocks 310. A top and a bottom horizontal panel are also provided. According to one aspect, the top and bottom horizontal panels provide a protective exterior surface enclosure for the internal MTGE blocks while the weight-bearing, intermediate horizontal panels and the bottom horizontal panel provide additional support for the weight of the internal components. According to yet another aspect, the intermediate horizontal panels provide a vertical separation of MTGE blocks 310 at which a band can be extended around the corner components in a horizontal plane without impacting the extended cable management edges of the MTGE blocks 310. The intermediate horizontal panels thus assist with providing structural rigidity of the MELS IT rack 300.

The four corner components 306 provide alignment for the vertically stacked MTGE blocks 310. Banding component(s) 304 surround a perimeter of the horizontal panel and extend around the corner components 306 and a horizontal perimeter of the rack structure in order to stabilize the vertically stacked sub-groups and provide lateral support for the rack structure. Banding component(s) 304 and corner components 306 collectively support a fixed position for the stacked sub-groups and/or prevent all lateral horizontal movements (i.e., forward/backward and sideways). Use of corner components 306 also prevents axial movement of MTGE blocks 310 once the banding is put in place.

Figure 4:
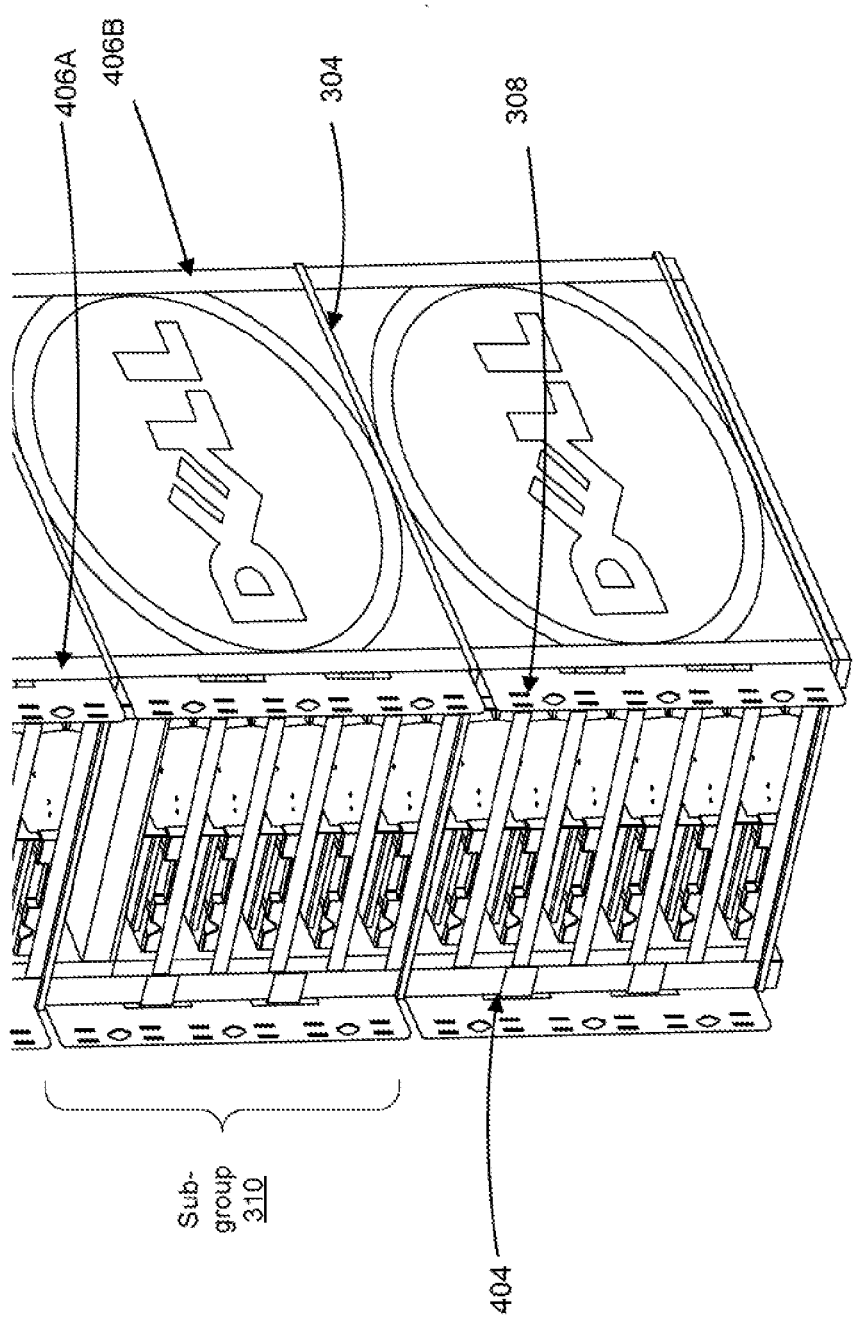
FIG. 4 provides a detailed frontal view of the MELS IT rack, according to one embodiment.

FIG. 4 provides a detailed frontal view of the modular IT rack, according to one embodiment. As illustrated within FIG. 4, corner components 306 of rack 300 comprise first and second corner components 406A, 406B and provide alignment for the vertically stacked sub-groups. First corner components 406A are affixed to an outer surface of the enclosure and provide rack sub-group alignment by having flanges 404 which are affixed to and/or inserted into grooves provided within cable support components 308. Second corner components 406B are substantially vertically running 90 degree brackets (or L-shaped components) and provide MTGE block alignment by being physically abutted to an outer corner surface of side panels of MTGE unit 302 and to back panel(s) (of the enclosure/rack assembly).

Banding component(s) 304 are extended around at least two and preferably four cable support components and a horizontal panel. In addition, banding components 304 surround a perimeter of the horizontal panel and extend around corner components 306 and a horizontal perimeter of the rack structure in order to stabilize the vertically stacked MTGE blocks 310 and provide lateral support for the rack structure. For example, when secured by banding components 304, corner components 306 support a fixed position for the stacked MTGE blocks 310 and/or prevent individual lateral (horizontal) movements of respective MTGE blocks 310 (i.e., forward, backward and/or sideways). Use of corner components 306 also prevents axial movement of MTGE blocks 310 once the banding is put in place.

Figure 5:
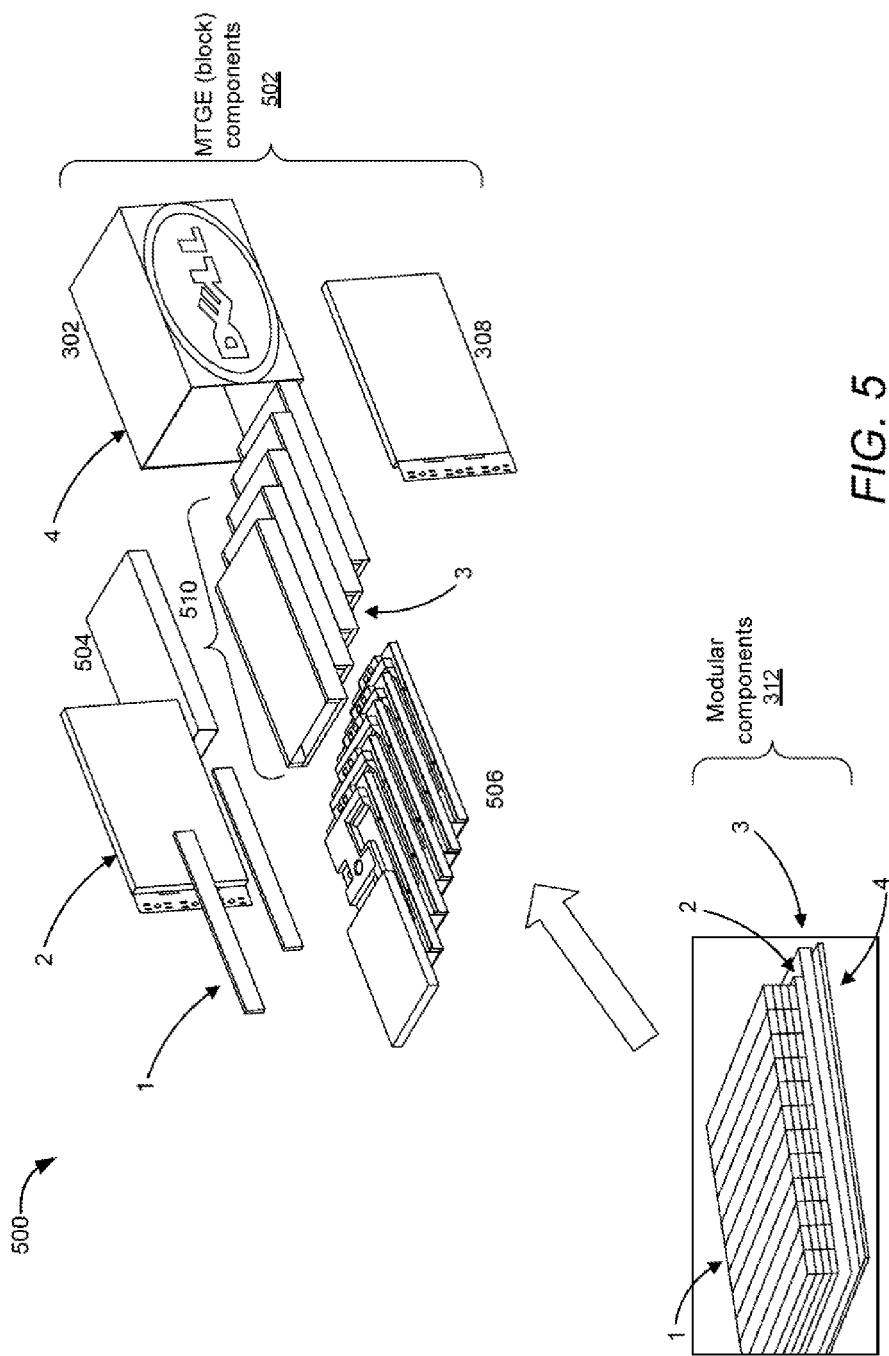
FIG. 5 is an exploded view of rack components used to assemble and enclose a MTGE unit of the MELS IT rack, according to one embodiment.

FIG. 5 is an exploded view of rack components used to assemble and enclose a MTGE block of the modular IT rack, according to one embodiment. Exploded view 500 of FIG. 5 is presented in view of FIG. 3 to facilitate a description of a process for assembling MTGE blocks 310 which are further used to assemble rack 300. As illustrated via exploded view 500, MTGE components 502 comprise MTGE units 302 which respectively enclose sub-groups of ITGR trays 510 and corresponding cable support components 308. Each sub-group of ITGR trays 510 comprises a specific number of ITGR trays. Also illustrated within exploded view 500 are electronic components 506 or IT gear which can be inserted into ITGR trays 510 following an assembly of the ITGR trays using modular components 312.

MTGE units 302 are rectangular shaped enclosures assembled using respective modular components, each of which is identified as component "4". As illustrated within exploded view 500, marketing labels (e.g., labels illustrating "DELL") can be adhered to an outer surface of the MTGE units 302. In one embodiment, component 4 is a light weight cardboard module that is particularly designed to be utilized as a MTGE unit.

ITGR trays 510 are assembled using multiple modular components including at least one chassis housing component identified as component "3" and several structural side components/units identified as component "1". In one embodiment, component 3 is a light weight cardboard module that is particularly designed to be utilized as an ITGR tray. In one implementation, each of ITGR trays 510 is assembled by (i) extending tray housing component into a pre-defined shape, (ii) inserting two cardboard modules (e.g., component 1) into the sides of folded tray housing component and optionally (iii) respectively adhering the two cardboard modules to an inner surface of each of the two side panels of the expanded tray housing component. The inserted cardboard modules (i.e., component 1) is particularly designed to provide rigidity to each of trays 510.

A selected number of vertically stacked trays 510 represent a sub-group, and trays within the sub-group are directly stacked on and/or below other trays such that an identified tray makes direct contact with at least one other tray. Each sub-group of trays 510 is bordered by a cable support panel on each of first and second sides of the sub-group. In one embodiment, an outer surface of each of the vertically stacked trays 510 can be adhered to an inner surface of a corresponding cable support panel flanking the ITGR trays 510 within the sub-group.

Each sub-group of trays and cable support panels bordering the sub-group are inserted within MTGE unit 302 to construct/assemble a MTGE block 310. Each MTGE block 310 is vertically stacked with the intermediate horizontal panels placed between adjacent MTGE blocks 310. A top and a bottom horizontal panel are also provided. According to one aspect, the top and bottom horizontal panels provide a protective exterior surface enclosure for the internal MTGE blocks while the weight-bearing, intermediate horizontal panels and the bottom horizontal panel provide additional support for the weight of the internal components. According to yet another aspect, the intermediate horizontal panels 314 provide a vertical separation of MTGE blocks 310 at which a band can be extended around the corner components in a horizontal plane without impacting the extended cable management edges of the MTGE blocks 310. The intermediate horizontal panels thus assist with providing structural rigidity of the MELS IT rack 300 (FIG. 1).

In one embodiment, the modular components and/or cardboard modules of MELS IT rack 300 are designed in accordance with green technology requirements/specifications and/or standards. Furthermore, in one or more related embodiments, the modular components and/or cardboard modules are biodegradable.

Figure 6:
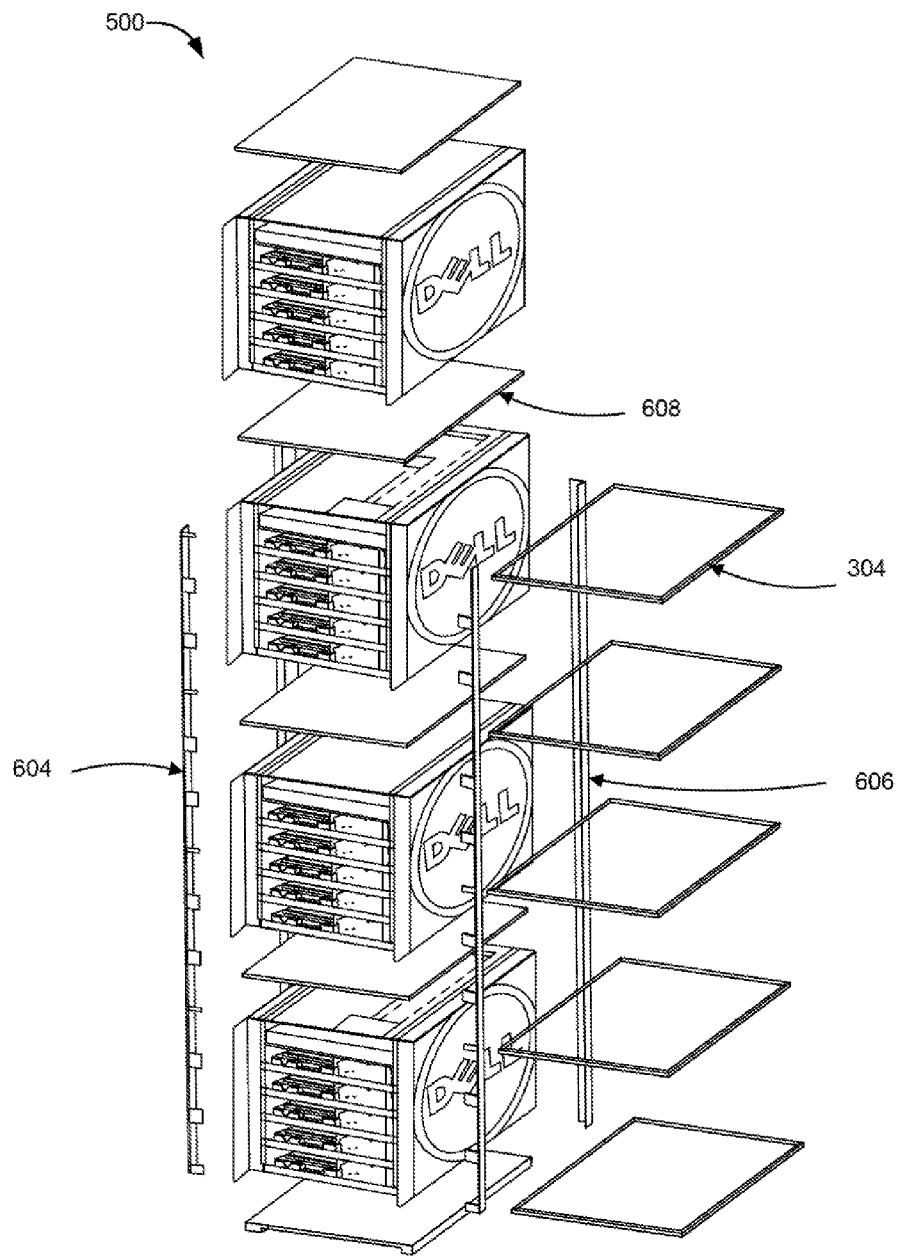
FIG. 6 is an exploded view of the MELS IT rack illustrating the rack components used to assemble the MELS IT rack, according to one embodiment.

FIG. 6 is an exploded view of the MELS IT rack illustrating the modular rack components used to assemble the MELS IT rack 300, according to one embodiment. Exploded view 600 of FIG. 6 is presented to facilitate a description of a process for assembling MELS rack 300 (FIGS. 3 and 4) from rack components. As illustrated via exploded view 600, rack 300 comprises MTGE units 302 which are volumetrically shaped exterior casings that respectively enclose a plurality of ITGR trays and corresponding cable support components to provide the individual MTGE blocks 310. A user/assembler of the MELS IT rack 300 assembles modular tray grouping and enclosure (MTGE) units 302 using a first set of cardboard modules. Each MTGE block 310 includes a specific number of trays in which electronic components, such as IHS 100 or other IT gear 150 (FIG. 1) can be inserted. The trays are vertically stacked and are comprised of a lightweight material constructed with a contiguous surface material having foldable corners/edges that enable each tray to be extendable into a rectangular shaped volume within which an IT gear can be inserted. MELS IT rack 300 further comprises vertical corner components 306 and banding components 304. In addition, MELS IT rack 300 comprises horizontal panels 608. Additionally, MELS IT rack 300 comprise back panels 904 (FIG. 9) and/or baffle 1000 (FIG. 10).

MELS IT rack 300 is assembled by vertically stacking each enclosed rack sub-group (and cable support panels) on and/or below other enclosed MTGE blocks 310 while placing horizontal panels above, below and/or between enclosed MTGE blocks 310. The outer (i.e., top and bottom) horizontal panels provide a protective enclosure for internal components while the weight-bearing horizontal panels, which include the bottom horizontal panels, provide support for a weight of the internal components.

Corner components comprise first and second corner components and provide alignment for the vertically stacked MTGE blocks 310. First corner components 604 are affixed to an outer surface of the enclosure and provide rack sub-group alignment by having flanges 404 (FIG. 4) which are affixed to and/or inserted into grooves provided within cable support components 308 (FIG. 3). Second corner components 606 are substantially vertically running 90 degree brackets (or L-shaped components) and provide MTGE block alignment by being physically abutted to an outer corner surface of side panels of enclosure 302 and to back panel(s) (of the enclosure/rack assembly).

Banding component(s) 304 are extended around at least two and preferably four cable support components and a horizontal panel. In addition, banding components 304 surround a perimeter of the horizontal panel and extend around corner components 604 and 606 and a horizontal perimeter of the rack structure in order to stabilize the vertically stacked MTGE blocks 310 and provide lateral support for the rack structure. For example, when secured by banding components 304, corner components 604 and 606 support a fixed position for the stacked MTGE blocks 310 and/or prevent individual lateral (horizontal) movements of respective MTGE blocks (i.e., forward/backward and sideways). Use of corner components 604 and 606 also prevents axial movement of MTGE blocks 310 once the banding is put in place.

Figure 7:
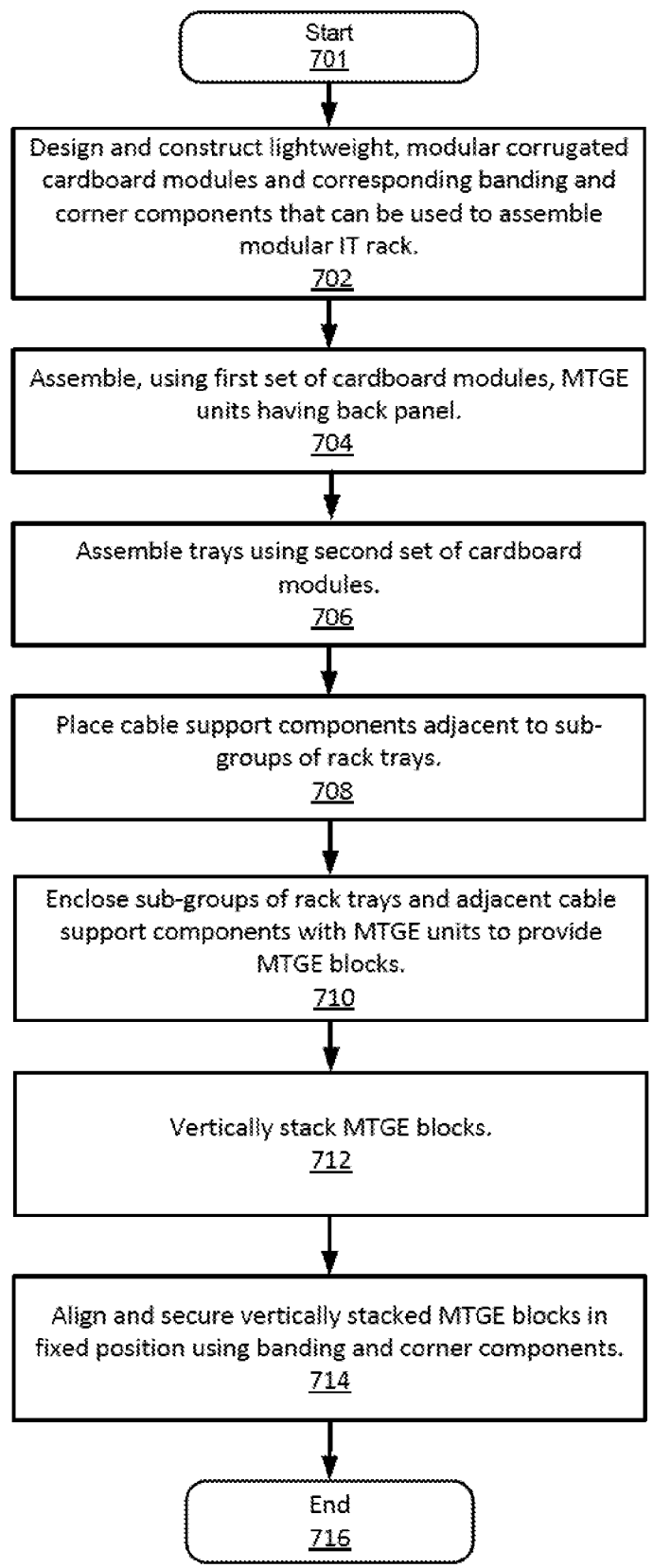
FIG. 7 is a flow chart illustrating a method for assembling a MELS IT rack, in accordance with one or more embodiments.
Figure 8:
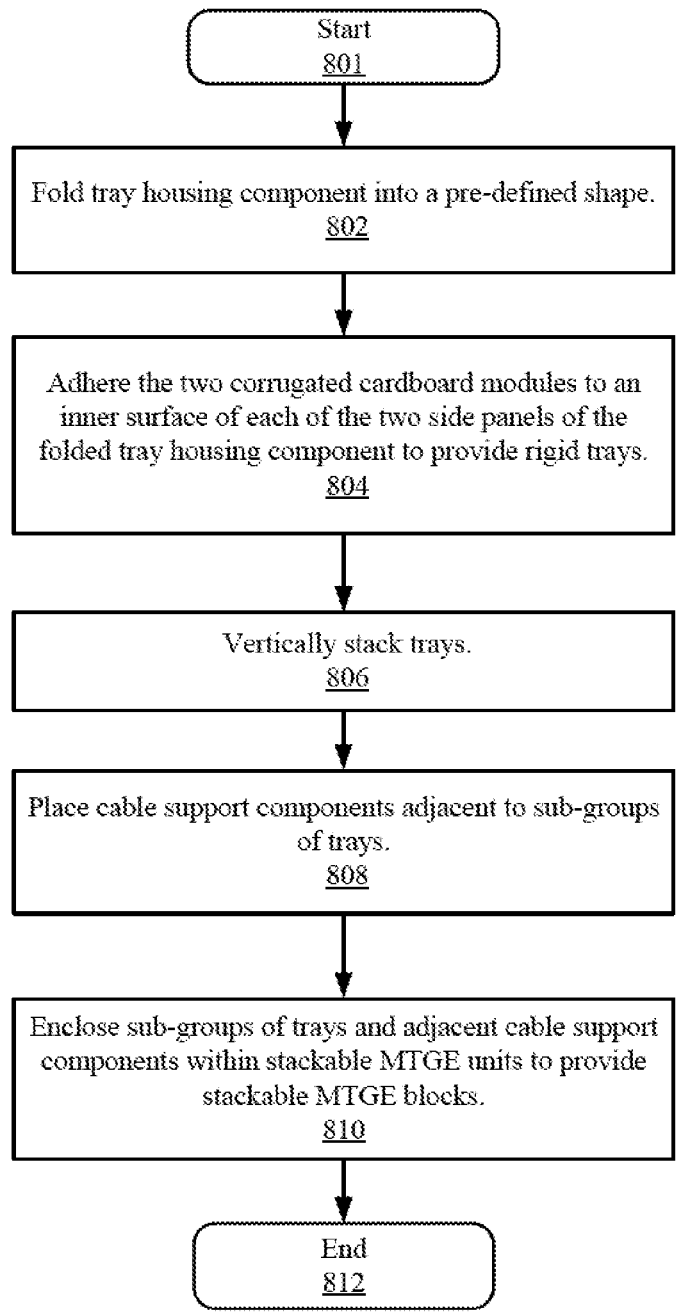
FIG. 8 is a flow chart illustrating a method for assembling an MTGE unit as an IT sub-group, in accordance with one or more embodiments.

FIG. 7 and FIG. 8 present flowcharts illustrating example methods by which modular components 312 presented within the preceding figures can be utilized to implement different aspects of the one or more embodiments of the disclosure. Generally, method 700 and method 800 collectively represent methods for assembling a MELS IT rack capable of supporting server/IHS 100. The description of each method is provided with general reference to the specific components illustrated within the preceding figures. In the discussion of FIG. 7 and FIG. 8, reference is also made to elements described in FIGS. 1 and 3-6.

FIG. 7 illustrates an example method for assembling a modular IT rack. Method 700 begins at the start block 701 and proceeds to block 702 at which a manufacturer designs and constructs lightweight, modular corrugated cardboard modules and corresponding banding and corner components that can be used to assemble modular IT rack 300. A user/assembler of modular IT rack 300 assembles MTGE units using a first set of cardboard modules (block 704). In addition, a back panel which can be implemented using a baffle is affixed to a respective MTGE unit. The user assembles trays 510 using a second set of cardboard modules (block 706). The user places/positions cable support components adjacent to sub-groups of rack trays (block 708). The user encloses sub-groups of trays and the adjacent cable support components within MTGE units to provide MTGE blocks or mini-rack modules (block 710). The user vertically stacks the MTGE blocks (block 712). The user aligns and secures the vertically stacked MTGE blocks in a fixed position using banding and corner components (block 714). The process ends at block 716.

FIG. 8 illustrates an example method for assembling an enclosed rack sub-group. Method 800 begins at start block 801 and proceeds to block 802 where a user/assembler of modular IT rack 300 folds tray housing components into a pre-defined shape. The user adheres two corrugated cardboard modules to an inner surface of each of the two side panels of the folded tray housing component to provide rigid trays (block 804). The user vertically stacks trays (block 806). The user places/positions cable support components adjacent to sub-groups of trays (block 808). The user encloses sub-groups of trays and the adjacent cable support components within stackable MTGE units to provide stackable MTGE blocks (block 810). The process ends at block 812.

In the above described flow charts, one or more of the methods may be embodied in a computer readable device containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Figure 9:
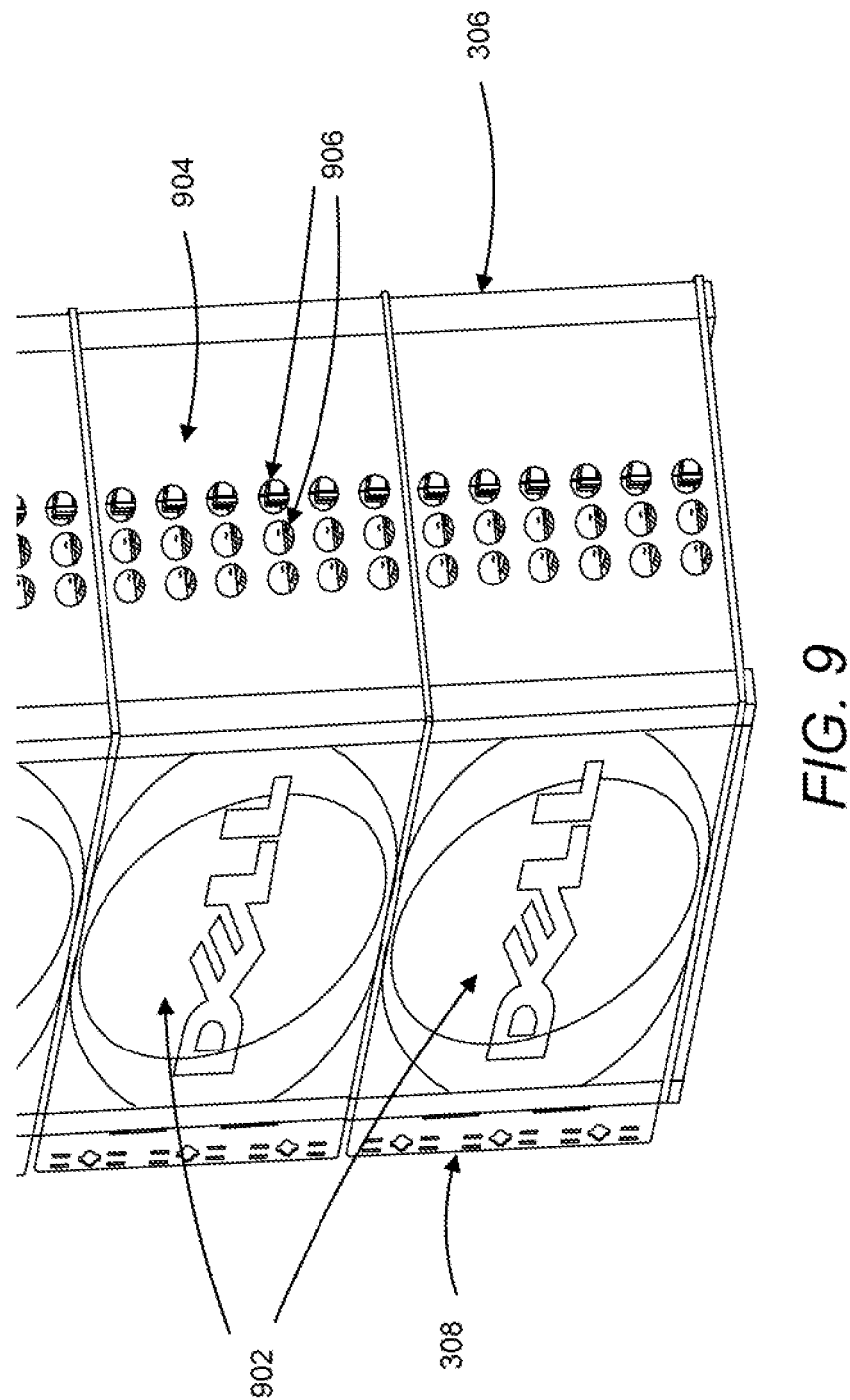
FIG. 9 is an anterior view of the MELS IT rack showing a back panel of the rack, according to one embodiment.
Figure 10:
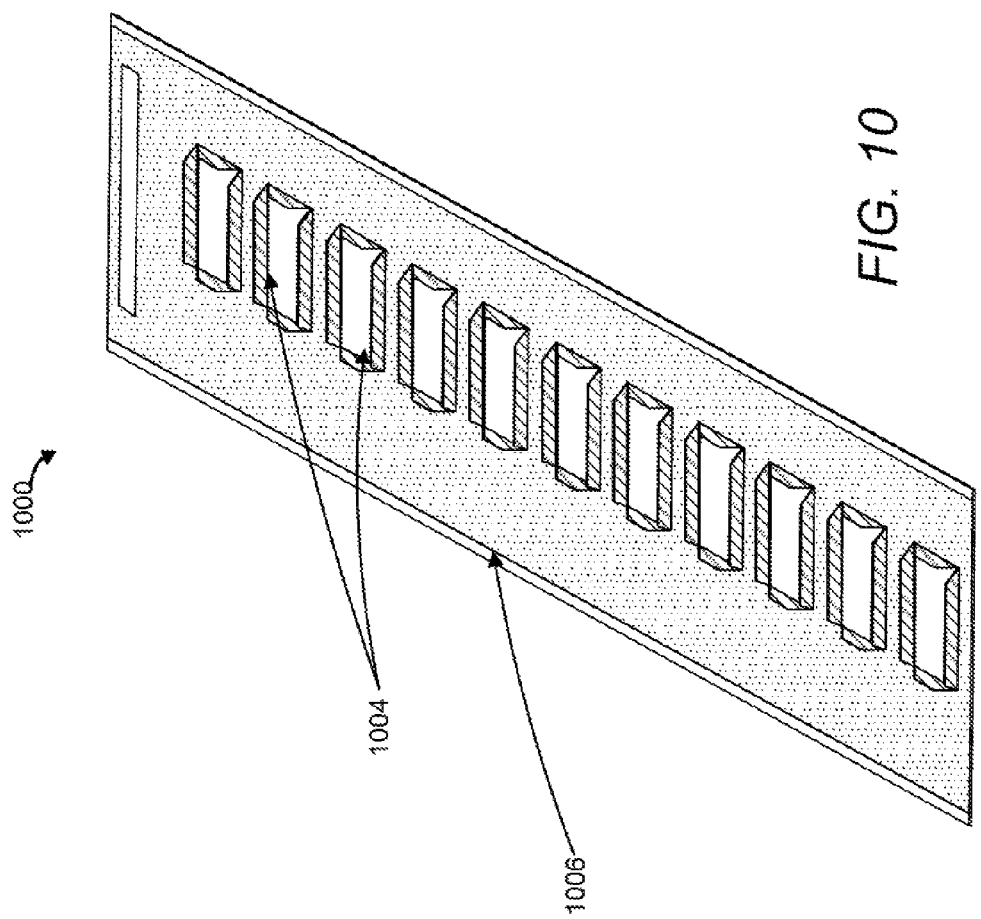
FIG. 10 illustrates a baffle that can be used in lieu of and/or as the back panel of the an IT rack, such as MELS IT rack, according to one embodiment.

FIG. 9 is a first anterior view of the MELS IT rack 300, according to one embodiment. MELS IT rack 300 comprises side panels 902, cable support component 308, corner components 306 and back panel 904. Illustrated within back panel 904 are cut-out sections 906 that support a location and functionality of air flow ducts (not shown) within the rack assembly. It is important to note that the MELS IT rack 300 can be configured without a back panel and/or with a standard back panel as can be provided with a standard rack. According to one aspect of the disclosure, MELS IT rack 300 can include a specialized baffle providing the functionality of hot and cold aisle separation and associated device cooling features to MELS IT rack 300.

FIG. 10 illustrates a baffle that can be used in place of a back panel of an IT rack, including the MELS IT rack 300, according to one embodiment. In one implementation of a rack assembly, as shown in FIG. 9, a first type of back panel can be utilized. However, in another implementation, a second type of back panel which is illustrated as baffle 1000 can be utilized. Baffle 1000 is an air flow management support component having air flow directing (AFD) apertures 1004 or holes with flanges that fold inwards towards the chassis of the IT rack. Baffle 1000 is designed to guide airflow through the IT rack using the AFD apertures and to separate hot and cold aisles and is therefore referred to herein as hot aisle—cold aisle separator (HCS) baffle 1000. In one embodiment, HCS baffle 1000 is constructed from a light-weight material, such as corrugated cardboard, and the AFD apertures are cutout sections placed at vertical locations along the baffle at which the hot air exhaust from functioning IT gear can be directed away from the IT gear holding section of the MELS IT rack 300. The AFD apertures 1004 are specifically sized and positioned based on a chassis design to physically interface with a chassis of the rack in order to direct air-flow and/or provide separation for hot and cold aisles. In one embodiment, the HCS baffle 1000 is made of a somewhat rigid material such that the HCS baffle 1000 provides additional structural support to the rear section of the MELS IT rack 300.

Figure 11:
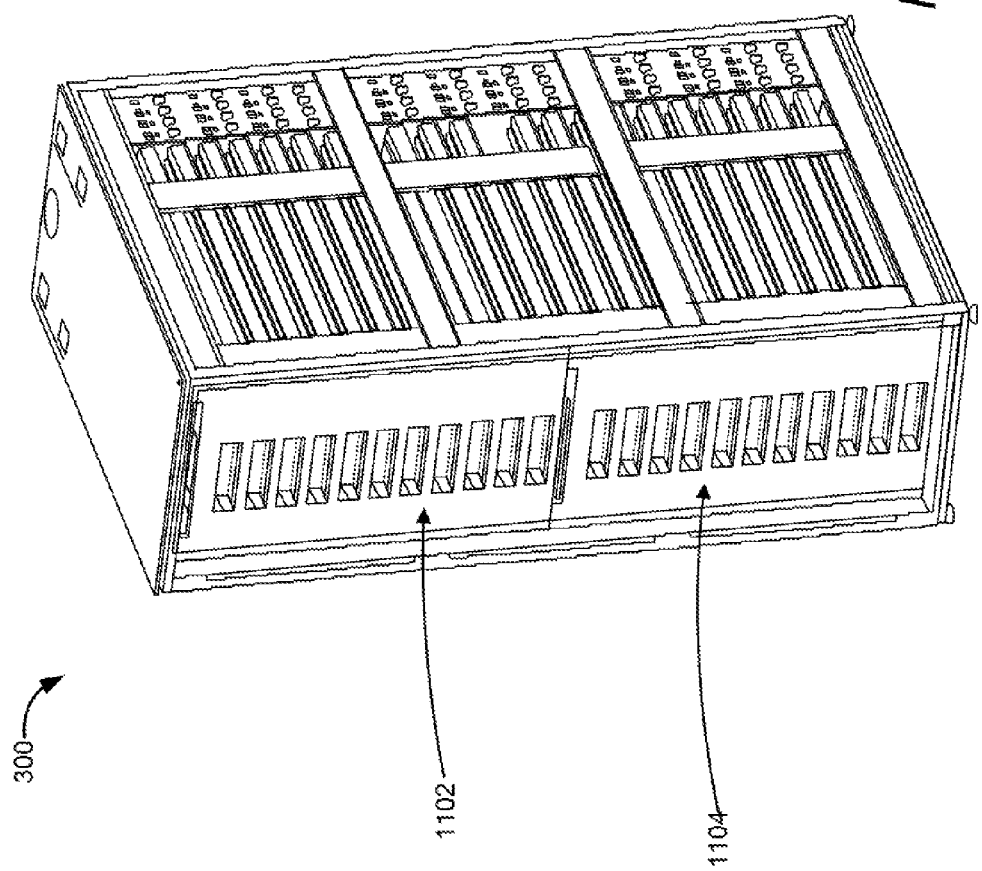
FIG. 11 is a first anterior view of the MELS rack showing an attached baffle, according to one embodiment.
Figure 12:
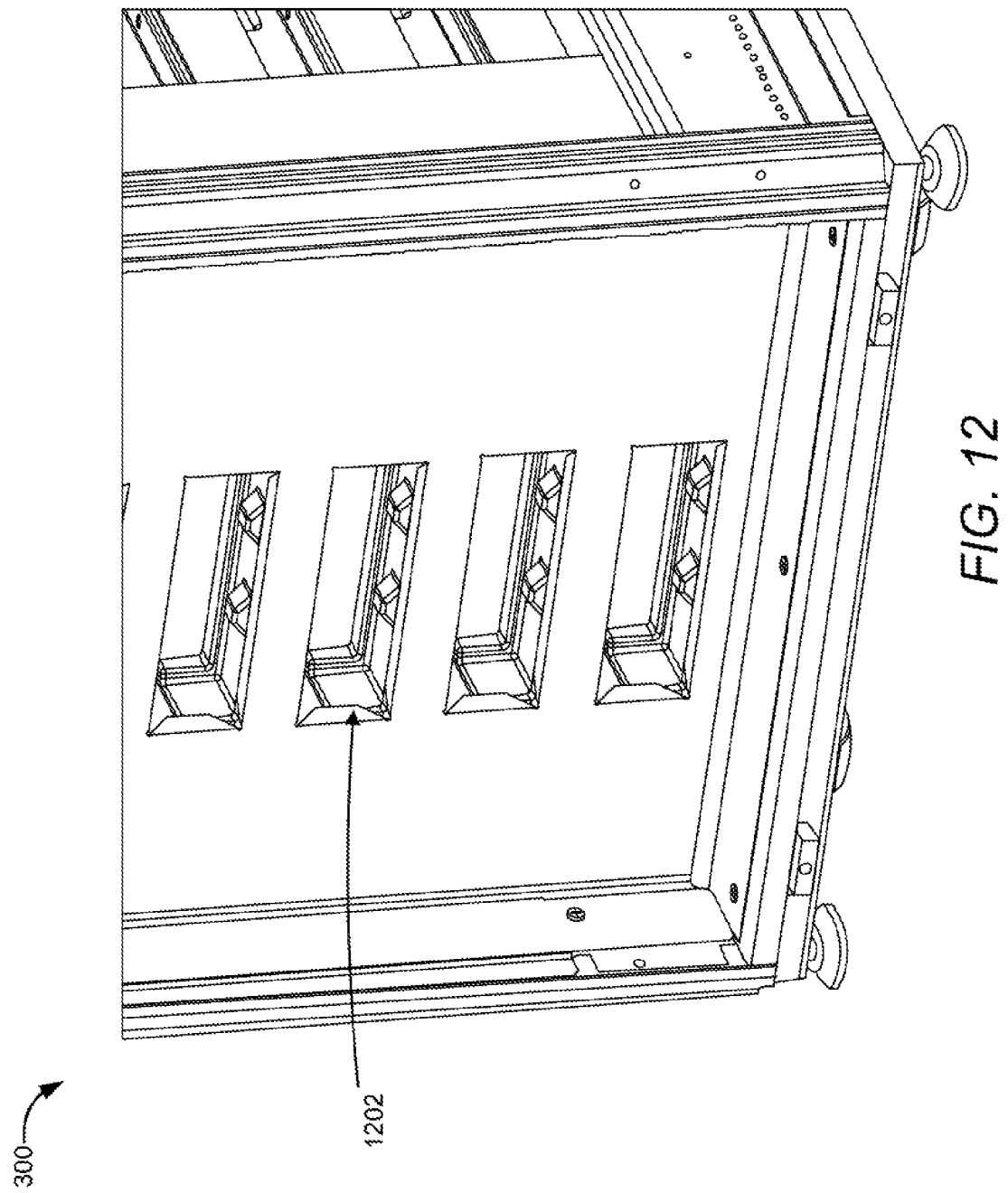
FIG. 12 is a second anterior view of the MELS rack showing the baffle, according to one embodiment.

FIG. 11 is a first anterior view of a rack showing a baffle attached thereto, according to one embodiment. The back panel can be implemented using two (or more) individual baffle components 1102 and 1104, sized according to a size of the modular IT rack and/or the sizes of the MTGE blocks 310. FIG. 12 is a second anterior view of the rack providing a detailed view of the HCS baffle 1000 attached to the modular IT rack, according to one embodiment. Each baffle 1102, 1104 is adhered via adhesive edges of a corresponding baffle to side panels 902 of IT rack 300 to collectively provide a back panel of IT rack 300. As indicated via FIGS. 11 and 12, baffle 1000, 1102 and 1104 includes segments 1202 that fold inward at the AFD sections to enable air flow to be guided towards a back of the baffle 1000 outwards and away from the IT gear located within the cold aisle of the MELS IT rack 300.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, microcode, etc.) and hardware aspects that may all generally be referred to herein as a "circuit," "module," or "system."

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular information technology (IT) rack assembly for physically supporting at least one electronic component of an information handling system (IHS), the rack assembly comprising:
   a stacked arrangement of modular tray grouping and enclosure (MTGE) blocks, each MTGE block having:
      an exterior perimeter casing providing a volumetric, vertical space with lateral sides defining an interior space extending between a front opening and a rear opening of the casing, the casing created with defined foldable corners/edges that enable the casing to be flat packed for shipping and then reconfigured via the lateral sides to a vertical orientation that provides the volumetric space; and
      a plurality of trays comprised of a lightweight material constructed with a contiguous surface material having foldable corners/edges that enable the tray to be (i) flat packed and (ii) extendable into a rectangular shaped volume within which an IT gear can be inserted, wherein the plurality of trays are stacked vertically within the volumetric, vertical space of the exterior perimeter casing;
   a plurality of corner components positioned vertically at each of four corners of the stacked arrangement of mini rack modules and which provides vertical rigidity to the rack assembly; and
   at least one banding component that extends horizontally around the perimeter of the stacked arrangement of mini rack modules to fixably hold each of the corner components in place and provide lateral support for the rack structure; and
   wherein the at least one banding component and the plurality of corner components are positioned to respectively provide structural stability in a horizontal plane and vertical rigidity in a vertical plane.

2. The rack assembly of claim 1, further comprising:
   at least one cable management support component integrated into an external flange of the exterior perimeter casing.

3. The rack assembly of claim 1, further comprising:
   at least one air flow management ducting component attached to a rear of the modular IT rack assembly and which supports hot aisle and cold aisle separation.

4. The rack assembly of claim 3, wherein:
   the at least one air flow management ducting components includes a baffle having a plurality of air flow directing (AFD) sections that have flanges which direct exhaust air flow from heat dissipating IT gear located within the volumetric vertical space of the modular IT rack assembly; and
   the baffle is attached to a rear section of the chassis of the modular IT rack system, wherein the AFD sections fold inward to be adhered to the rear section and to separate the cold air section from the hot exhaust air section.

5. The rack assembly of claim 1, wherein:
the MTGE blocks, the trays and the perimeter casing are assembled using flat-packed cardboard modules that are constructed using a composite material, wherein the modules include at least one of (a) adhesive sections and (b) corrugated sections.

6. The rack assembly of claim 1, wherein the corner components are substantially vertically running brackets positioned against an outer surface of the MTGE unit to provide alignment for the stacked MTGE blocks and further comprise:
first corner components which have flanges that are inserted into grooves provided within the cable support components; and
second corner components that are substantially 90 degree brackets that are physically abutted to an outer corner surface of side panels of the MTGE unit and to back panels of the rack assembly.

7. The rack assembly of claim 1, further comprising:
horizontal panels which include:
intermediate horizontal panels placed between adjacent MTGE blocks;
top and bottom horizontal panels that provide a protective exterior surface enclosure for the MTGE blocks; and
wherein the intermediate horizontal panels and the bottom horizontal panel are weight-bearing panels that provide additional support for the weight of the internal components.

8. The rack assembly of claim 1, wherein:
the banding component are extended around a horizontal panel and placed between vertically adjacent cable support extensions.

9. An information handling system (IHS) comprising:
at least one electronic component; and
a stacked arrangement of modular tray grouping and enclosure (MTGE) blocks, each MTGE block having:
an exterior perimeter casing providing a volumetric, vertical space with lateral sides defining an interior space extending between a front opening and a rear opening of the casing, the casing created with defined foldable corners/edges that enable the casing to be flat packed for shipping and then reconfigured via the lateral sides to a vertical orientation that provides the volumetric space; and
a plurality of trays comprised of a lightweight material constructed with a contiguous surface material having foldable corners/edges that enable the tray to be (i) flat packed and (ii) extendable into a rectangular shaped volume within which an IT gear can be inserted, wherein the plurality of trays are stacked vertically within the volumetric, vertical space of the exterior perimeter casing;
a plurality of corner components positioned vertically at each of four corners of the stacked arrangement of mini rack modules and which provides vertical rigidity to the rack assembly;
at least one banding component that extends horizontally around the perimeter of the stacked arrangement of mini rack modules to fixably hold each of the corner components in place and provide lateral support for the rack structure; and
wherein the at least one banding component and the plurality of corner components are positioned to respectively provide structural stability in a horizontal plane and vertical rigidity in a vertical plane.

10. The IHS of claim 9, wherein the rack assembly further comprises:
at least one cable management support component integrated into an external flange of the exterior perimeter casing.

11. The IHS of claim 9, wherein the rack assembly further comprises:
at least one air flow management ducting component attached to a rear of the modular IT rack assembly and which supports hot aisle and cold aisle separation.

12. The IHS of claim 11, wherein:
the at least one air flow management ducting components includes a baffle having a plurality of air flow directing (AFD) sections that have flanges which direct exhaust air flow from heat dissipating IT gear located within the volumetric vertical space of the modular IT rack assembly; and
the baffle is attached to a rear section of the chassis of the modular IT rack system, where the AFD sections fold inward to be adhered to the rear section and to separate the cold air section from the hot exhaust air section.

13. The IHS of claim 9, wherein:
the MTGE blocks, the trays and the perimeter casing are assembled using flat-packed cardboard modules that are constructed using a composite material, wherein the modules include at least one of (a) adhesive sections and (b) corrugated sections.

14. The IHS of claim 9, wherein the corner components are substantially vertically running brackets positioned against an outer surface of the MTGE unit to provide alignment for the stacked MTGE blocks and further comprise:
first corner components which have flanges that are inserted into grooves provided within the cable support components; and
second corner components are substantially 90 degree brackets that are physically abutted to an outer corner surface of side panels of the MTGE unit and to back panels of the rack assembly.

15. The IHS of claim 9, further comprising:
horizontal panels which include:
intermediate horizontal panels placed between adjacent MTGE blocks;
top and bottom horizontal panels that provide a protective exterior surface enclosure for the MTGE blocks; and
wherein the intermediate horizontal panels and the bottom horizontal panel are weight-bearing panels that provide additional support for the weight of the internal components.

16. The IHS of claim 9, wherein:
the banding component are extended around at least two cable support components and a horizontal panel.

17. A method for constructing a modular IT rack assembly that supports air flow management for an information handling system (IHS), the method comprising:
assembling trays using corrugated cardboard modules;
affixing cable support components to sub-groups of trays;
assembling at least one rectangular shaped modular tray grouping and enclosure (MTGE) unit;
inserting within the at least one respective rectangular shaped MTGE unit respective trays and affixed cable support components to provide MTGE blocks;
vertically stacking the MTGE blocks; and
securely aligning the at least one vertically stacked MTGE blocks in a fixed position using banding and corner components.

18. The method of claim 17, further comprising:
placing corner components vertically against corner edges of the stacked arrangement of MTGE blocks in order to provide vertical alignment for MTGE blocks; and
affixing banding components in a horizontal direction around a horizontal support panel and the corner components, wherein the banding components and corner components collectively provide stability in a horizontal plane.

19. The method of claim 17, further comprising:
integrating cable management support components into an external flange of the exterior perimeter casing.

20. The method of claim 17, further comprising:
attaching at least one air flow management ducting component to a rear of the modular IT rack assembly to provide hot aisle and cold aisle separation, wherein the at least one air flow management ducting components includes a baffle having a plurality of air flow directing (AFD) sections that have flanges which direct exhaust air flow from heat dissipating IT gear located within the volumetric vertical space of the modular IT rack assembly.

\* \* \* \* \*